United States Patent
Xu et al.

(10) Patent No.: US 8,853,814 B2
(45) Date of Patent: *Oct. 7, 2014

(54) MINIATURE THERMOELECTRIC ENERGY HARVESTER AND FABRICATION METHOD THEREOF

(75) Inventors: Dehui Xu, Shanghai (CN); Bin Xiong, Shanghai (CN); Yuelin Wang, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/110,141

(22) PCT Filed: Apr. 6, 2012

(86) PCT No.: PCT/CN2012/073565
§ 371 (c)(1),
(2), (4) Date: Oct. 4, 2013

(87) PCT Pub. No.: WO2013/127114
PCT Pub. Date: Sep. 6, 2013

(65) Prior Publication Data
US 2014/0021576 A1    Jan. 23, 2014

(30) Foreign Application Priority Data
Feb. 28, 2012    (CN) .......................... 2012 1 0049164

(51) Int. Cl.
H01L 35/10 (2006.01)
H01L 35/32 (2006.01)
H01L 35/22 (2006.01)
H01L 35/34 (2006.01)

(52) U.S. Cl.
CPC ............... *H01L 35/10* (2013.01); *H01L 35/32* (2013.01); *H01L 35/22* (2013.01); *H01L 35/34* (2013.01)
USPC ............................................. 257/467; 438/54

(58) Field of Classification Search
USPC ............................................. 257/467; 438/54
See application file for complete search history.

(56) References Cited

U.S. PATENT DOCUMENTS

2014/0026934 A1* 1/2014 Xu et al. ....................... 136/224

* cited by examiner

*Primary Examiner* — Marc Armand
(74) *Attorney, Agent, or Firm* — Tianhua Gu; Global IP Services (57) ABSTRACT

A miniature thermoelectric energy harvester and a fabrication method thereof. Annular grooves are fabricated on a low-resistivity silicon substrate to define silicon thermoelectric columns, an insulating layer is fabricated on the annular grooves, a thermoelectric material is filled in the annular grooves to form annular thermoelectric columns, and then metal wirings, passivation layers and supporting substrates are fabricated, thereby completing the fabrication process. The silicon thermoelectric column using a silicon base material simplifies the fabrication process. The fabrication of the thermocouple structure is one thin-film deposition process, which simplifies the process. The use of silicon as a component of the thermocouple has a high Seebeck coefficient. The use of vertical thermocouples improves the stability. Since the thermocouple structure is bonded to the upper supporting substrate and lower supporting substrate by wafer-level bonding, the fabrication efficiency is improved.

12 Claims, 9 Drawing Sheets

MINIATURE THERMOELECTRIC ENERGY HARVESTER AND FABRICATION METHOD THEREOF

BACKGROUND OF THE PRESENT INVENTION

1. Field of Invention

The present invention relates to the semiconductor field, and specifically to a miniature thermoelectric energy harvester and a fabrication method thereof.

2. Description of Related Arts

With the development of wireless network sensor technology, its applications in the industrial, commercial, medical, consumption and military fields are gradually expanded. Power source is always critical to prolonging the service life and reducing the cost of wireless network sensors. In environmental extremes or other occasions unreachable to human beings, or when a network node moves or changes, it is difficult or even impossible to replace a battery, making it crucial to effectively provide energy to a wireless network sensor. An effective solution is to harvest ambient energy through energy harvesting, store the energy and provide the energy to the wireless network sensor. Currently, the most commonly used energy harvesting method is to use the Seebeck effect to convert a temperature difference in an environment to electrical energy for energy harvesting. On the other hand, as system miniaturization leads to decreasing system size and power consumption, energy required for system operation also decreases; therefore, a thermoelectric chip may be used to harvest ambient energy so as to supply power to the system.

Figure 1A:
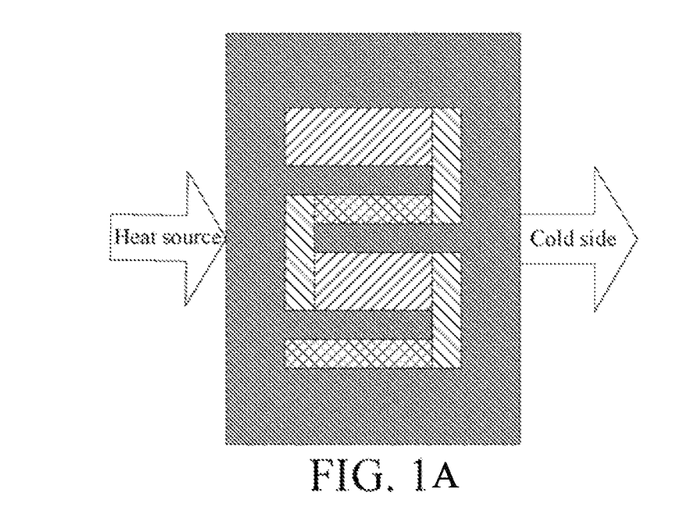
FIG. 1A to FIG. 1C are schematic structural views of a thermoelectric energy harvester in the prior art.
Figure 1B:
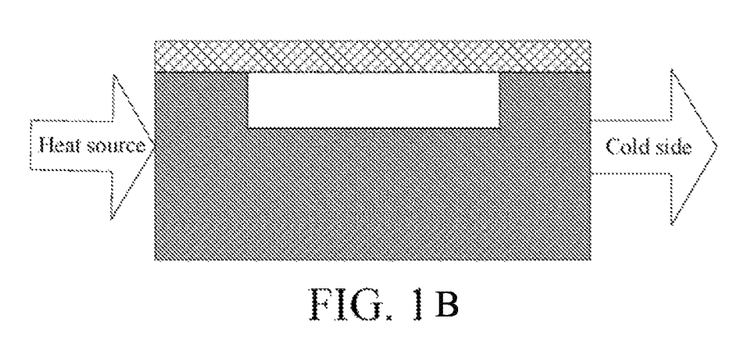

Current miniature thermoelectric energy harvesters are mainly classified into two types, that is, planar type and vertical type. FIG. 1A is a schematic structural view of a planar-type miniature thermoelectric energy harvester, wherein the direction of heat flow is parallel to the substrate, and thermocouples are arranged parallel to the substrate. Since the planar-type thermoelectric energy harvester is in contact with the ambient environment through cross sections of its components, there is a small contact area between the thermoelectric energy harvesting chip and the environment, leading to undesirable thermal contact between the thermoelectric energy harvesting chip and the environment, and affecting the operating efficiency of the thermoelectric energy harvesting chip. However, the thermocouples on the substrate are generally fabricated by a planar semiconductor process, and the thermocouple length is 1-1000 μm dependent upon the photolithographic process, and the thermocouple length can be controlled through pattern design. In addition, to increase the thermal resistance of the thermoelectric energy harvesting chip, the thermocouple structure generally needs to be thermally insulated, that is, the substrate below the thermocouple is hollowed out. As a result, the thermocouple structure is eventually suspended on the substrate, with a cross-sectional structure as shown in FIG. 1B. Since the thermocouple is a suspended structure, the thermocouple microstructure is easily broken, degrading the reliability of the chip.

Figure 1C:
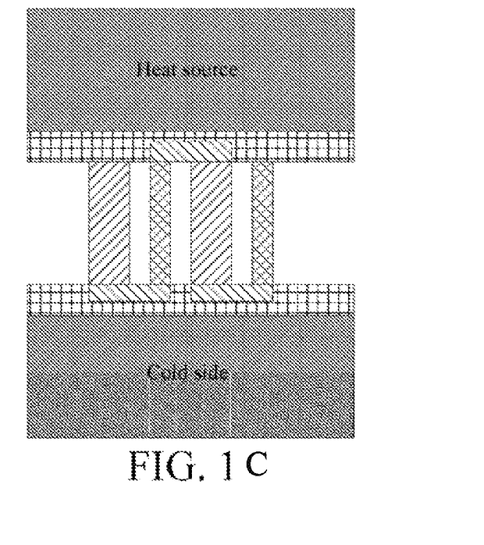

FIG. 1C is a schematic structural view of a vertical-type miniature thermoelectric energy harvester, where the direction of heat flow is perpendicular to the substrate, and thermocouples are arranged perpendicular to the substrate. Since the vertical-type thermoelectric energy harvester is in contact with the ambient environment through the whole substrate, there is a large contact area between the thermoelectric energy harvesting chip and the environment, so that good thermal contact is achieved between the thermoelectric energy harvesting chip and the environment, thereby improving the operating efficiency of the thermoelectric energy harvesting chip. However, since the thermocouples are arranged perpendicular to the substrate, the planar semiconductor process cannot be adopted, and instead, the thermocouples are generally fabricated by an electroplating or thin-film sputtering deposition process, resulting that the thermocouple length is limited by the process. The thickness of a film fabricated by the thin-film sputtering deposition process is generally smaller than 100 μm, while the thickness of a film fabricated by the electroplating process is generally smaller than 1000 μm. Current vertical-type thermoelectric energy harvesting chips generally adopt a BiTe-based material or a metal material such as Cu or Ni as the thermoelectric material. Since the metal material such as Cu or Ni has a small Seebeck coefficient, thermoelectric energy harvesting chips fabricated by using the metal material such as Cu or Ni as the thermoelectric material generally have low efficiency. Since the BiTe-based material has a high Seebeck coefficient, thermoelectric energy harvesting chips fabricated by using the BiTe-based material generally have high efficiency. However, the BiTe-based material requires a high cost, and contains toxic substances, which limits the use of BiTe thermoelectric energy harvesting chips. In addition, since the composition of a thermocouple requires two thermoelectric materials, the vertical-type thermoelectric energy harvester generally needs to be subjected to two electroplating or thin-film sputtering deposition processes in order to fabricate a thermocouple material, which further increases the cost of the thermoelectric energy harvesting chip. Moreover, the fabrication efficiency of the vertical-type thermoelectric energy harvester is low, because the thermoelectric energy harvester is thermally and mechanically connected to upper and lower substrates through chip-level bonding.

SUMMARY OF THE PRESENT INVENTION

In view of the disadvantages in the prior art, a purpose of the present invention is to provide a miniature thermoelectric energy harvester and a fabrication method thereof, so as to solve the problems of high fabrication cost, low fabrication efficiency and low energy harvesting efficiency in the prior art.

In order to accomplish the above and other purposes, the present invention provides a method for fabricating a miniature thermoelectric energy harvester, at least comprising: 1) providing a silicon substrate, and etching an upper surface of the silicon substrate to form at least two annular grooves, two neighboring of which are arranged at an interval, so that all the annular grooves and silicon columns surrounded by the annular grooves form a thermopile region; 2) forming an insulating layer on a surface of the annular groove, and then filling a thermoelectric material in the annular groove to form an annular thermoelectric column, so that the annular thermoelectric column and the silicon column surrounded by the annular thermoelectric column form a thermocouple; 3) fabricating an upper metal wiring to connect the silicon column and the annular thermoelectric column in a same thermocouple, and then fabricating an upper passivation layer on the upper surface of the silicon substrate; 4) providing an upper supporting substrate, and bonding the upper supporting substrate to the upper surface of the silicon substrate; 5) thinning the silicon substrate until a lower surface of the thermocouple is exposed; 6) fabricating a lower metal wiring to connect the annular thermoelectric column and the silicon column in two neighboring annular thermocouples, and then fabricating a lower passivation layer on a lower surface of the silicon substrate; 7) etching the silicon substrate between two neighboring thermocouples to form an isolation structure; and 8) providing a lower supporting substrate, and bonding the lower supporting substrate to the lower surface of the silicon substrate, thereby completing fabrication of a miniature thermoelectric energy harvester.

In the method for fabricating a miniature thermoelectric energy harvester consistent with the present invention, the annular thermoelectric column is a column structure having a rectangular ring or circular ring cross section, and the silicon column is a column structure having a rectangular or circular cross section.

As a preferred solution of the method for fabricating a miniature thermoelectric energy harvester consistent with the present invention, the step 7) further comprises a step of filling an electrical and thermal insulating material in the isolation structure.

As a preferred solution of the method for fabricating a miniature thermoelectric energy harvester consistent with the present invention, the step 7) further comprises a step of selectively etching a periphery around the thermopile region to form an annular isolation groove.

As a preferred solution of the method for fabricating a miniature thermoelectric energy harvester consistent with the present invention, the bonding process in the step 4) is wafer-level hermetic bonding, and the bonding process in the step 8) is wafer-level vacuum bonding.

As a preferred solution of the method for fabricating a miniature thermoelectric energy harvester consistent with the present invention, the lower supporting substrate comprises a CMOS circuit structure, the lower passivation layer is etched to form a contact hole, and the CMOS circuit structure is connected to the lower metal wiring through the contact hole.

In the method for fabricating a miniature thermoelectric energy harvester consistent with the present invention, the annular thermoelectric column is made of a BiTe-based material, a polysilicon material, or metal Cu, Ni or Au, and the silicon column is made of low-resistivity silicon.

The present invention further provides a miniature thermoelectric energy harvester, at least comprising:

a thermopile, comprising at least two thermocouples, wherein each of the thermocouples is formed by a silicon column and an annular thermoelectric column surrounding the silicon column, and an isolation structure is formed between neighboring two thermocouples; an insulating layer, combined between the annular thermoelectric column and the silicon column; an upper metal wiring, connected to upper surfaces of the annular thermoelectric column and the silicon column in a same thermocouple; and a lower metal wiring, connected to lower surfaces of the annular thermoelectric column and the silicon column in two neighboring thermocouples;

passivation layers, comprising: an upper passivation layer, combined to an upper surface of the thermopile; and a lower passivation layer, combined to a lower surface of the thermopile; and supporting substrates, comprising: an upper supporting substrate, combined to a surface of the upper passivation layer; and a lower supporting substrate, combined to a surface of the lower passivation layer.

In the miniature thermoelectric energy harvester consistent with the present invention, the annular thermoelectric column is a column structure having a rectangular ring or circular ring cross section, and the silicon column is a column structure having a rectangular or circular cross section.

As a preferred solution of the miniature thermoelectric energy harvester consistent with the present invention, the miniature thermoelectric energy harvester further comprises an electrical and thermal insulating material filled in the isolation structure.

As a preferred solution of the miniature thermoelectric energy harvester consistent with the present invention, the lower supporting substrate comprises a CMOS circuit structure, the lower passivation layer has a contact hole, and the CMOS circuit structure is connected to the thermopile through the contact hole.

In the miniature thermoelectric energy harvester consistent with the present invention, the annular thermoelectric column is made of a BiTe-based material, a polysilicon material, or metal Cu, Ni or Au, and the silicon column is made of low-resistivity silicon.

As described above, the miniature thermoelectric energy harvester and fabrication method thereof consistent with the present invention have the following beneficial effects: Annular grooves are fabricated on a low-resistivity silicon substrate to define silicon thermoelectric columns, an insulating layer is fabricated on the annular grooves, a thermoelectric material is filled in the annular grooves to form annular thermoelectric columns, and then metal wirings, passivation layers and supporting substrates are fabricated, thereby completing the fabrication process. In the present invention, the silicon thermoelectric column is fabricated by directly using a silicon base material, which simplifies the fabrication process. Compared with a miniature thermoelectric energy harvester in the prior art, the present invention has the following advantages:

1) Fabrication of the thermocouple structure is completed by only one thin-film deposition process, which simplifies the fabrication process.

2) The use of silicon as a component of the thermocouple ensures that the thermocouple has a high Seebeck coefficient.

3) The use of vertical thermocouples having a column structure avoids suspended microstructures, thereby improving the mechanical stability of the thermoelectric energy harvester.

4) Since the thermocouple structure is bonded to the upper supporting substrate and the lower supporting substrate by wafer-level bonding, the fabrication efficiency is improved.

BRIEF DESCRIPTION OF THE DRAWINGS

FIG. 1A and FIG. 2B are respectively schematic structural top and cross-sectional views of step 1) of a method for fabricating a miniature thermoelectric energy harvester consistent with the present invention.

LIST OF REFERENCE NUMERALS

101 Silicon substrate
102 Silicon column
103 Annular groove
104 Insulating layer
105 Annular thermoelectric column
106 Upper metal wiring
107 Lower metal wiring
108 Isolation structure
109 Electrical and thermal insulating material
110 Annular isolation groove
111 Upper supporting substrate
112 Lower supporting substrate
113 CMOS circuit structure
114 Contact hole
121 Upper passivation layer
122 Lower passivation layer

DETAILED DESCRIPTION OF THE PREFERRED EMBODIMENTS

The embodiments of the present invention are described in the following through specific examples, and one of ordinary skill in the art can easily understand other advantages and effects of the present invention according to the content disclosed in the specification. The present invention may also be implemented or applied through other different specific examples, and various modifications and variations may be made to the details in the specification on the basis of different opinions and applications without departing from the principle of the present invention.

Reference is made to FIG. 1A to FIG. 12. It should be noted that, the drawings provided in the embodiment merely exemplarily describe a basic concept of the present invention, and the drawings merely show components related to the present invention, but are not drawn according to the numbers, shapes and sizes of components in actual implementation. The shapes, the numbers and the sizes of the components can be randomly changed in the actual implementation, and the layout of components may be more complicated.

Embodiment 1

Referring to FIG. 1A to FIG. 9, the present invention provides a method for fabricating a miniature thermoelectric energy harvester, which at least includes the following steps.

Figure 2:
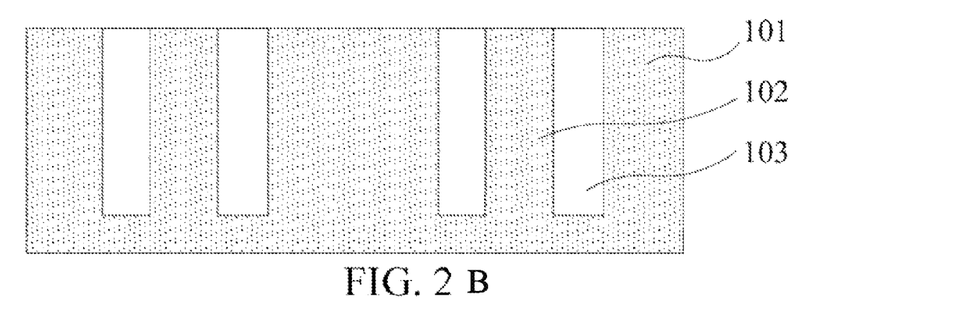
Figure 2A:
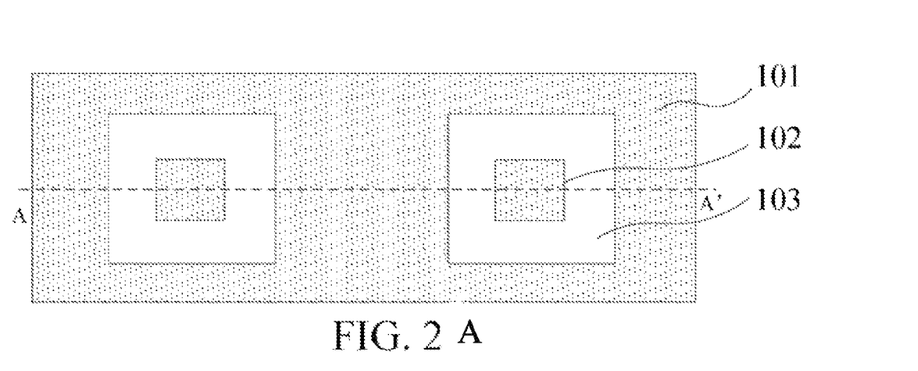
Figure 3:
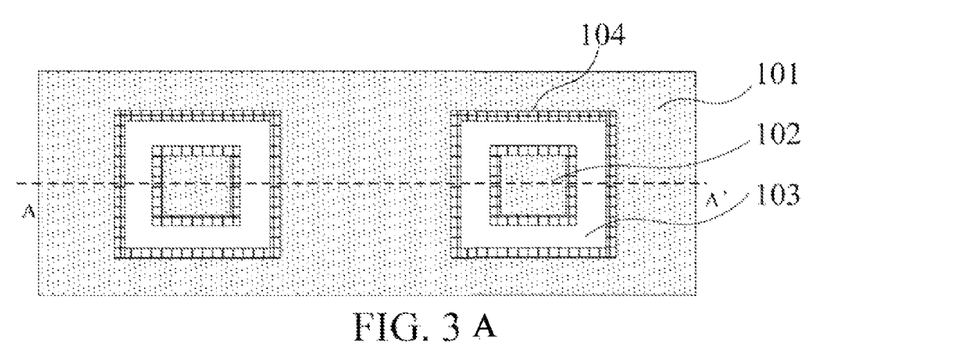
FIG. 3A to FIG. 3D are respectively schematic structural top and cross-sectional views of step 2) of the method for fabricating a miniature thermoelectric energy harvester consistent with the present invention.
Figure 3B:
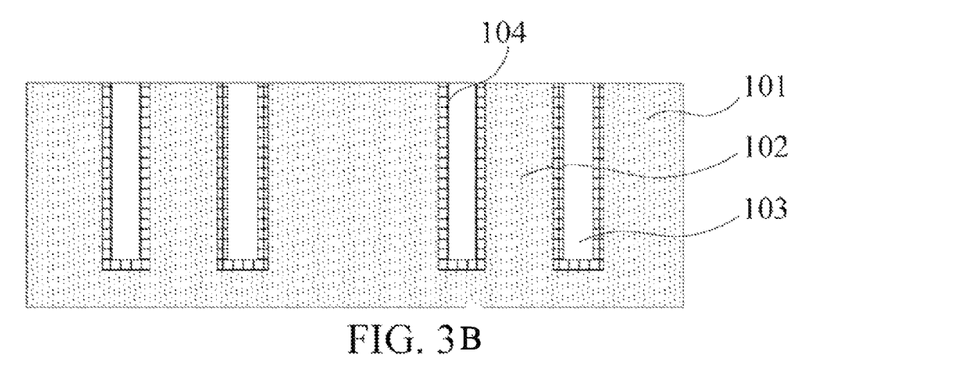
Figure 3C:
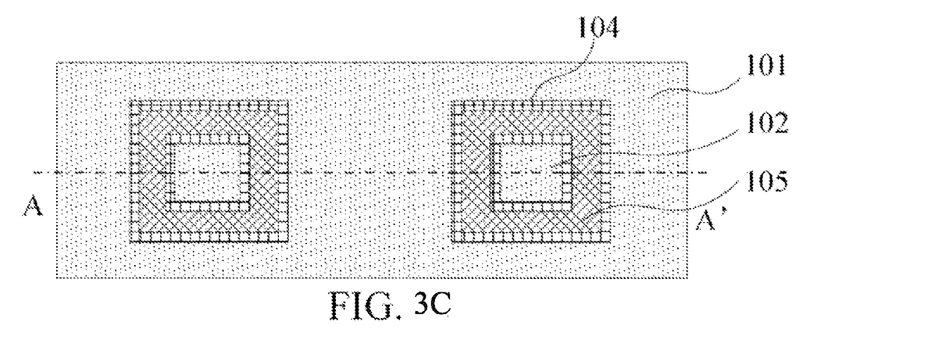
Figure 3D:
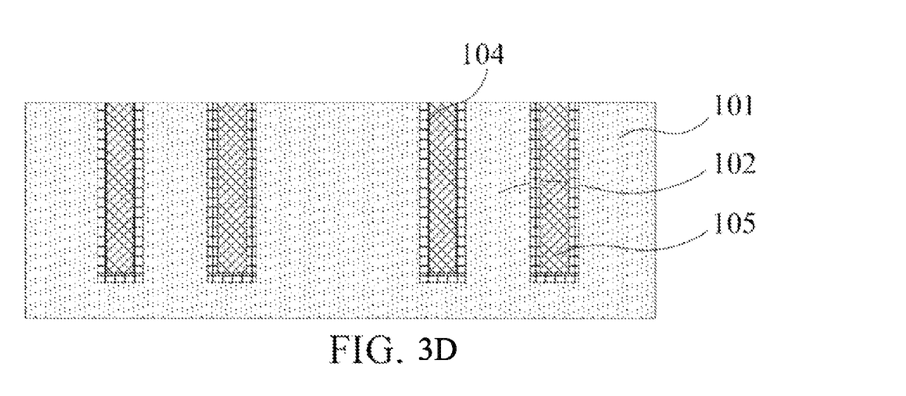

First, as shown in FIG. 1A to FIG. 2B, step 1) is performed, wherein a silicon substrate 101 is provided, and an upper surface of the silicon substrate 101 is etched to form at least two annular grooves 103, two neighboring of which are arranged at an interval, so that all the annular grooves 103 and silicon columns 102 surrounded by the annular grooves 103 form a thermopile region. In this embodiment, the silicon substrate 101 is a low-resistivity silicon substrate 101, which has a high Seebeck coefficient and low resistivity, and therefore can ensure high thermoelectric efficiency when being fabricated into a thermoelectric column. A photolithographic pattern is fabricated on a surface of the low-resistivity silicon substrate 101, and the surface of the low-resistivity silicon substrate 101 is etched to form, on the low-resistivity silicon substrate 101, at least two annular grooves 103, two neighboring of which are arranged at an interval, so that all the annular grooves 103 and silicon columns 102 surrounded by the annular grooves 103 form a thermopile region. Considering the process consistency and smoothness of components, the cross section of the annular groove 103 is a rectangular ring structure. Definitely, in other embodiments, the cross section of the annular groove 103 may also be ring structures of other shapes such as a circular ring structure. The silicon column 102 is a region surrounded by the annular groove 103, and therefore, the cross section of the silicon column 102 is rectangular. Definitely, in other embodiments, the silicon column 102 may also be column structures of other shapes such as a circular column structure.

Next, as shown in FIG. 3A to FIG. 3D, step 2) is performed, wherein an insulating layer 104 is formed on a surface of the annular groove 103, and then a thermoelectric material is filled in the annular groove 103 to form an annular thermoelectric column 105, so that the annular thermoelectric column 105 and the silicon column 102 surrounded by the annular thermoelectric column 105 form a thermocouple. In this embodiment, a $SiO_2$ film is deposited in the annular groove 103 by chemical vapor deposition or physical vapor deposition to insulate the surface of the annular groove 103. Definitely, a material such as $Si_3N_4$ may also be used to fabricate a thin-film insulating layer 104. Afterward, a thermoelectric material is deposited in the annular groove 103 by using a thin-film deposition technique such as chemical vapor deposition or physical vapor deposition. In this embodiment, the thermoelectric material is a BiTe-based material in order to ensure high thermoelectric conversion performance. Definitely, in other embodiments, the thermoelectric material may be a polysilicon material, or metal Cu, Ni or Au, or the like. The annular thermoelectric column 105 and the silicon column 102 surrounded by the annular thermoelectric column 105 form a thermocouple.

Figure 4A:
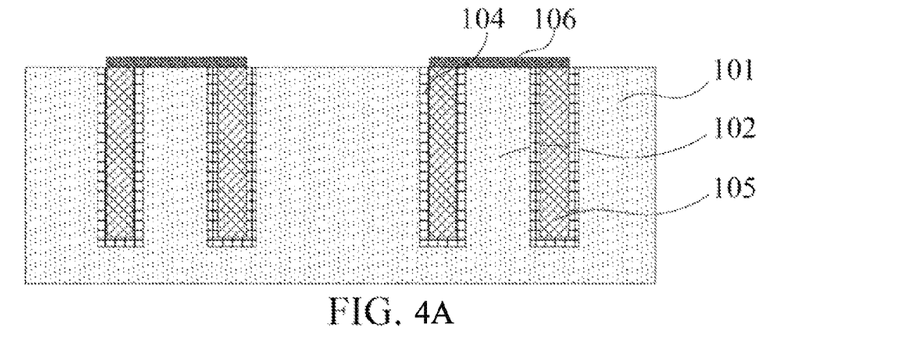
FIG. 4A and FIG. 4B are respectively schematic structural top and cross-sectional views of step 3) of the method for fabricating a miniature thermoelectric energy harvester consistent with the present invention.
Figure 4B:
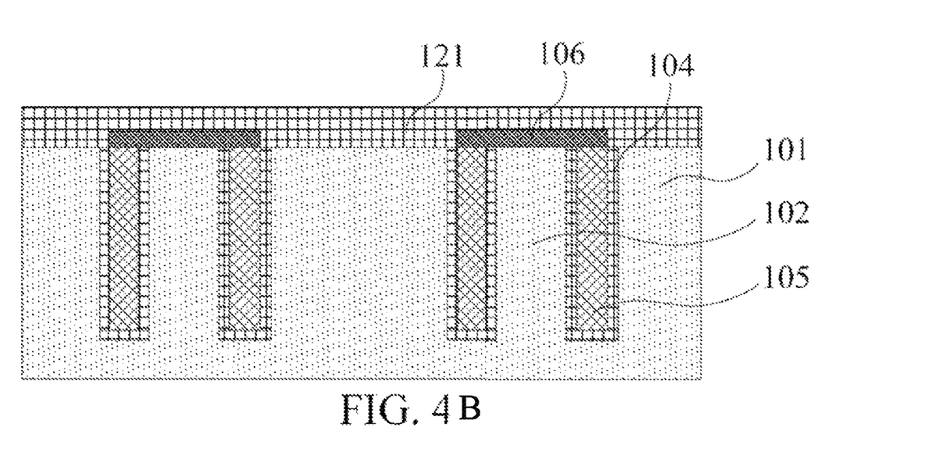

Then, as shown in FIG. 4A and FIG. 4B, step 3) is performed, wherein an upper metal wiring 106 is fabricated to connect the silicon column 102 and the annular thermoelectric column 105 in a same thermocouple, and then an upper passivation layer 121 is fabricated on the upper surface of the silicon substrate 101. In this embodiment, an upper metal wiring 106 is fabricated on the upper surface of each thermocouple by using photolithography and deposition techniques, so as to connect the annular thermoelectric column 105 and the silicon column 102 in each thermocouple. Afterward, an upper passivation layer 121 is fabricated on the upper surface of the silicon substrate 101 by chemical vapor deposition, wherein the upper passivation layer 121 is made of $SiO_2$, $Si_3N_4$ or the like.

Figure 5:
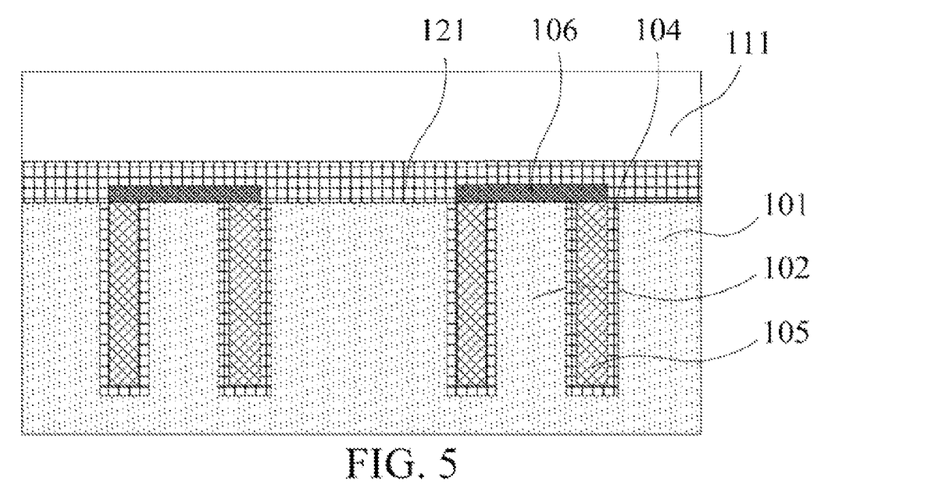
FIG. 5 is a schematic structural view of step 4) of the method for fabricating a miniature thermoelectric energy harvester consistent with the present invention.

Then, as shown in FIG. 5, step 4) is performed, wherein an upper supporting substrate 111 is provided, and the upper supporting substrate 111 is bonded to the upper surface of the silicon substrate 101. In this embodiment, the upper supporting substrate 111 has good thermal conduction properties.

Figure 6:
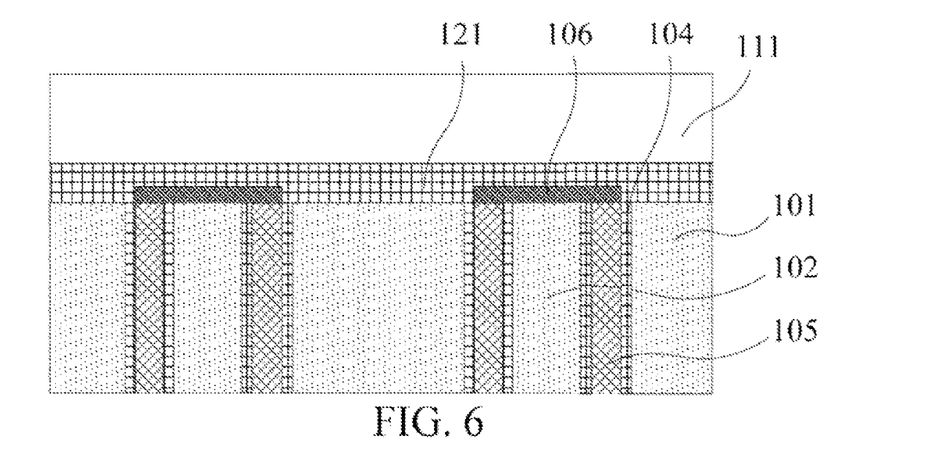
FIG. 6 is a schematic structural view of step 5) of the method for fabricating a miniature thermoelectric energy harvester consistent with the present invention.

Then, as shown in FIG. 6, step 5) is performed, wherein the silicon substrate 101 is thinned until a lower surface of the thermocouple is exposed. In this embodiment, a lower surface of the silicon substrate 101 is etched by chemical corrosion with HF or a mixture of HF and $HNO_3$ as an etching solution, wherein the structure of the insulating layer 104 at the bottom of the annular groove 103 is etched until the lower surface of the thermocouple is exposed, and the surface after etching may be polished by mechanical chemical polishing to prepare for subsequent processes. Definitely, the silicon substrate 101 may also be thinned by directly using mechanical chemical polishing, optionally in combination with a smart-cut technique.

Figure 7A:
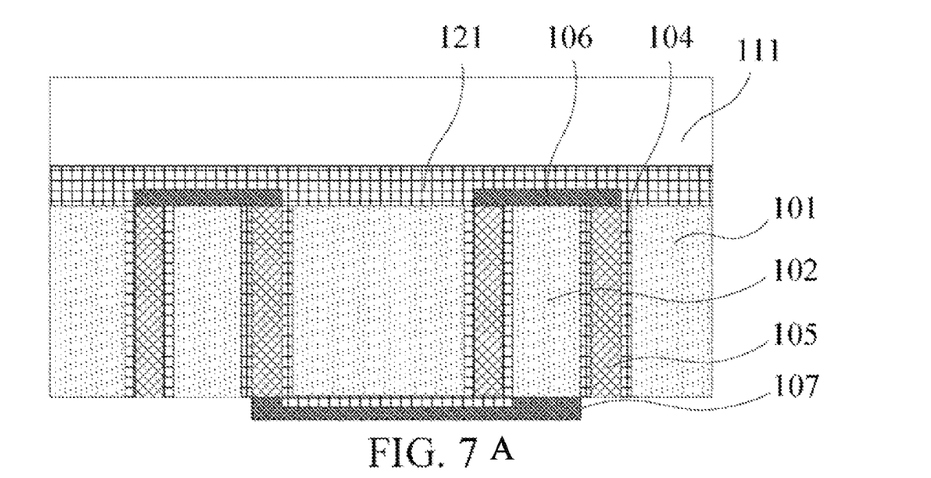
FIG. 7A and FIG. 7B are respectively schematic structural top and cross-sectional views of step 6) of the method for fabricating a miniature thermoelectric energy harvester consistent with the present invention.
Figure 7B:
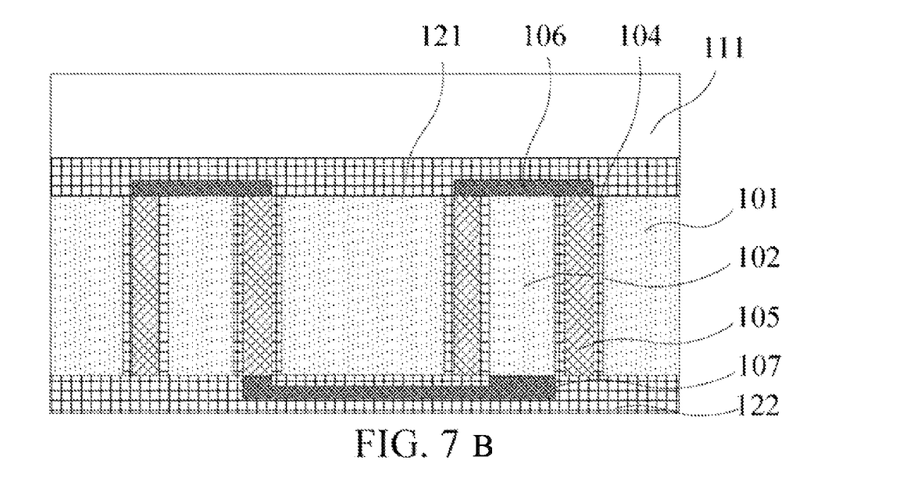

Then, as shown in FIG. 7A and FIG. 7B, step 6) is performed, wherein a lower metal wiring 107 is fabricated to connect the annular thermoelectric column 105 and the silicon column 102 in two neighboring annular thermocouples, and then a lower passivation layer 122 is fabricated on a lower surface of the silicon substrate 101. In this embodiment, the lower metal wiring 107 is fabricated by using photolithography and deposition techniques, so as to connect the annular thermoelectric column 105 and the silicon column 102 in two neighboring thermocouples. For example, there are two thermocouples, respectively defined as a first thermocouple and a second thermocouple. In this case, during fabrication of the lower metal wiring 107, first, one side, opposite to the first thermocouple, of the annular thermoelectric column 105 in the second thermocouple is insulated, and the silicon substrate between the first thermocouple and the second thermocouple is also insulated, and then the lower metal wiring 107 is fabricated by using photolithography and deposition techniques, so as to connect the annular thermoelectric column 105 of the first thermocouple and the silicon column 102 of the second thermocouple. Afterward, a lower passivation layer 122 is fabricated on the lower surface of the silicon substrate 101 by a method such as chemical vapor deposition, wherein the lower passivation layer 122 is made of $SiO_2$, $Si_3N_4$ or the like.

Figure 8:
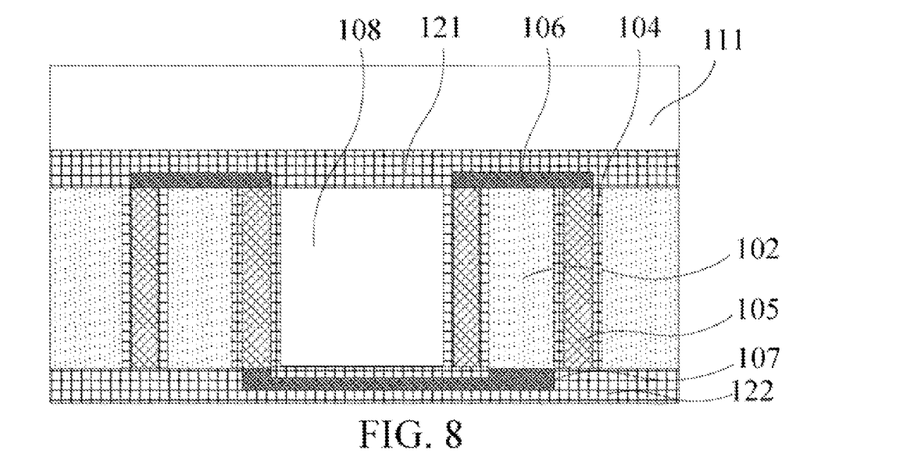
FIG. 8 is a schematic structural view of step 7) of the method for fabricating a miniature thermoelectric energy harvester consistent with the present invention.

Then, as shown in FIG. 8, step 7) is performed, wherein the silicon substrate 101 between two neighboring thermocouples is etched to form an isolation structure 108. In this embodiment, a region between the two thermocouples on the surface of the silicon substrate 101 is etched by chemical corrosion with the photolithographic pattern as a mask, wherein the etching is performed until reaching the upper passivation layer 121.

Figure 9:
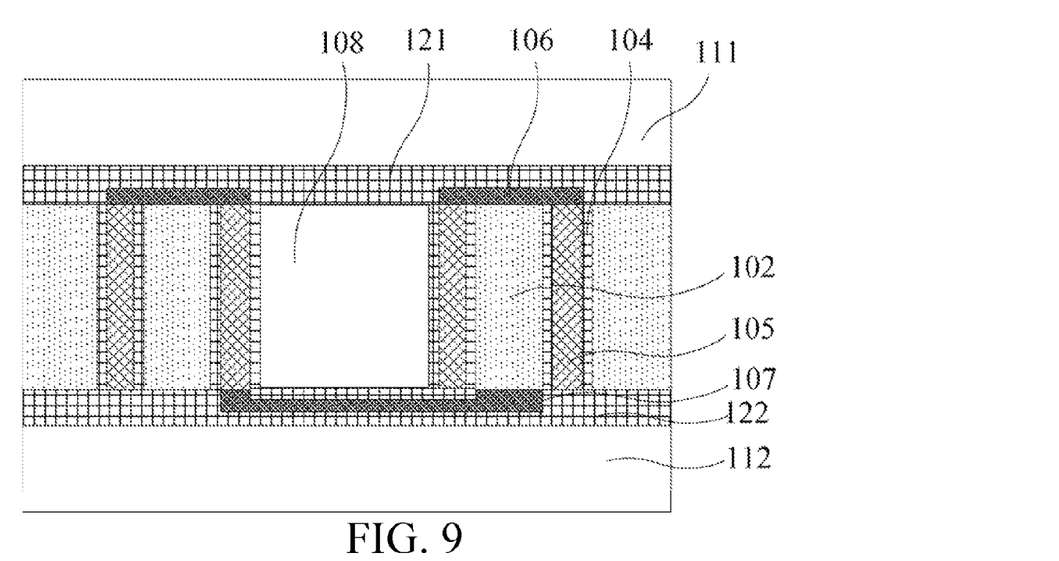
FIG. 9 is a schematic structural view of step 8) of the method for fabricating a miniature thermoelectric energy harvester consistent with the present invention.

Finally, as shown in FIG. 9, step 8) is performed, where a lower supporting substrate 112 is provided, and the lower supporting substrate 112 is bonded to the lower surface of the silicon substrate 101, thereby completing fabrication of the miniature thermoelectric energy harvester. The lower supporting substrate 112 also has good thermal conduction properties.

Embodiment 2

Referring to FIG. 1A to FIG. 10, basic steps of the method for fabricating a miniature thermoelectric energy harvester in this embodiment are as described in Embodiment 1. To achieve monolithic integration of the miniature thermoelectric energy harvester consistent with the present invention and a circuit so as to directly supply power to the circuit on-chip, the method for fabricating a miniature thermoelectric energy harvester consistent with the present invention further includes a step of fabricating a CMOS circuit structure 113 on the lower supporting substrate 112, where the lower passivation layer 122 is etched to form a contact hole 114, and then a metal wire is fabricated through the contact hole 114 to connect the CMOS circuit structure 113 and the lower metal wiring 107. Afterward, the lower passivation layer 122 is bonded to the lower supporting substrate 112. In this embodiment, to completely adopt the CMOS process so as to reduce the fabrication cost, the filled thermoelectric material may be replaced with a polysilicon material of a different doping type from the silicon substrate 101.

Embodiment 3

Referring to FIG. 1A to FIG. 9 and FIG. 11, basic steps of the method for fabricating a miniature thermoelectric energy harvester in this embodiment are as described in Embodiment 1. To further improve the mechanical stability and thermoelectric efficiency of a thermopile, the step 7) further includes a step of filling an electrical and thermal insulating material 109 in the isolation structure 108. Definitely, a periphery around the thermopile region may be etched first, following by filling a thermoelectric material in the etched structure and the isolation structure 108 at the same time.

Embodiment 4

Referring to FIG. 1A to FIG. 9 and FIG. 12, basic steps of the method for fabricating a miniature thermoelectric energy harvester in this embodiment are as described in Embodiment 1. The step 7) further includes a step of selectively etching the periphery around the thermopile region to form an annular isolation groove 110. The bonding process in the step 4) is wafer-level hermetic bonding, and the bonding process in the step 8) is wafer-level vacuum bonding.

Embodiment 5

Referring to FIG. 9, the present invention further provides a miniature thermoelectric energy harvester, which at least includes:

a thermopile, including at least two thermocouples, wherein each of the thermocouples is formed by a silicon column 102 and an annular thermoelectric column 105 surrounding the silicon column 102, and an isolation structure 108 is formed between neighboring two thermocouples. The annular thermoelectric column 105 is a column structure having a rectangular ring or circular ring cross section, and the silicon column 102 is a column structure having a rectangular or circular cross section. Definitely, in other embodiments, the annular thermoelectric column 105 and the silicon column 102 may also be column structures of other shapes. The annular thermoelectric column 105 is made of a BiTe-based material so as to ensure the thermoelectric conversion efficiency of the thermocouple. Definitely, in other embodiments, the annular thermoelectric column 105 may also be made of a polysilicon material, or metal Cu, Ni or Au, or other thermoelectric materials. The silicon column 102 is made of a low-resistivity silicon material, which has a high Seebeck coefficient and low resistivity, and therefore can ensure high thermoelectric efficiency when being fabricated into a thermoelectric column. An isolation structure 108 is formed between neighboring two thermocouples so as to ensure the thermoelectric energy harvesting efficiency.

The thermopile further includes an insulating layer 104, combined between the annular thermoelectric column 105 and the silicon column 102 to insulate the annular thermoelectric column 105 and the silicon column 102 in a same thermocouple. The insulating layer 104 may be made of $SiO_2$, $Si_3N_4$ or the like.

The thermopile further includes an upper metal wiring 106 connected to upper surfaces of the annular thermoelectric column 105 and the silicon column 102 in a same thermocouple and a lower metal wiring 107 connected to lower surfaces of the annular thermoelectric column 105 and the silicon column 102 in two neighboring thermocouples.

The miniature thermoelectric energy harvester further includes passivation layers, including an upper passivation layer 121 combined to an upper surface of the thermopile and a lower passivation layer 122 combined to a lower surface of the thermopile. The upper passivation layer 121 and the lower passivation layer 122 have thicknesses greater than those of the upper metal wiring 106 and the lower metal wiring 107, and are made of $SiO_2$, $Si_3N_4$ or the like.

The miniature thermoelectric energy harvester further includes supporting substrates, including an upper supporting substrate 111 combined to a surface of the upper passivation layer 121 and a lower supporting substrate 112 combined to a surface of the lower passivation layer 122. Both the upper supporting substrate 111 and the lower supporting substrate 112 have good thermal conduction properties.

Embodiment 6

Figure 10:
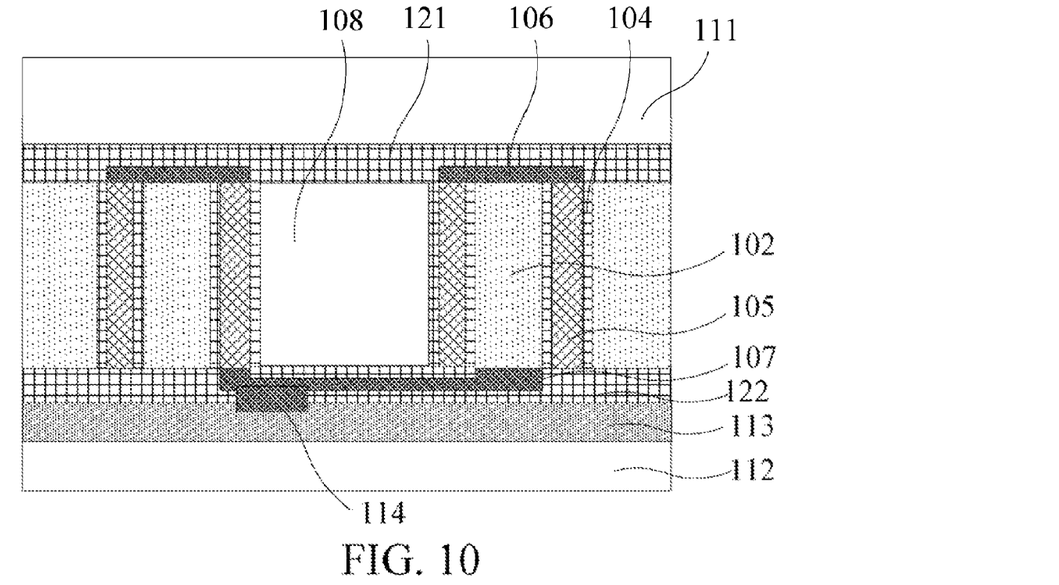
FIG. 10 is a schematic structural view of a miniature thermoelectric energy harvester consistent with the present invention when the lower supporting substrate has a CMOS circuit structure.

Referring to FIG. 10, the basic structure of the miniature thermoelectric energy harvester in this embodiment is as described in Embodiment 5. To achieve monolithic integration of the miniature thermoelectric energy harvester consistent with the present invention and a circuit so as to directly supply power to the circuit on-chip, the lower supporting substrate 112 of the miniature thermoelectric energy harvester in this embodiment includes a CMOS circuit structure 113, the lower passivation layer 122 has a contact hole 114, and the CMOS circuit structure is connected to the thermopile through the contact hole 114.

Embodiment 7

Figure 11:
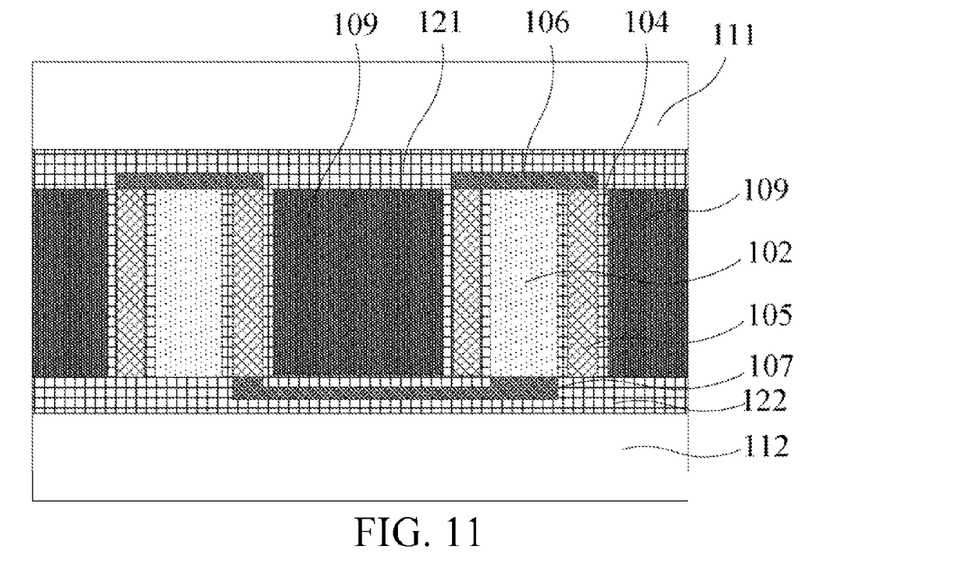
FIG. 11 is a schematic structural view of a miniature thermoelectric energy harvester consistent with the present invention when an isolation structure is filled with an electrical and thermal insulating material.

Referring to FIG. 11, the basic structure of the miniature thermoelectric energy harvester in this embodiment is as described in Embodiment 5. To further improve the mechanical stability and thermoelectric efficiency of the thermopile, the miniature thermoelectric energy harvester further includes an electrical and thermal insulating material 109 filled in the isolation structure. Definitely, the electrical and thermal insulating material 109 may also be filled after a periphery around the thermopile of the miniature thermoelectric energy harvester is removed, so that this structure has better mechanical stability.

Embodiment 8

Figure 12:
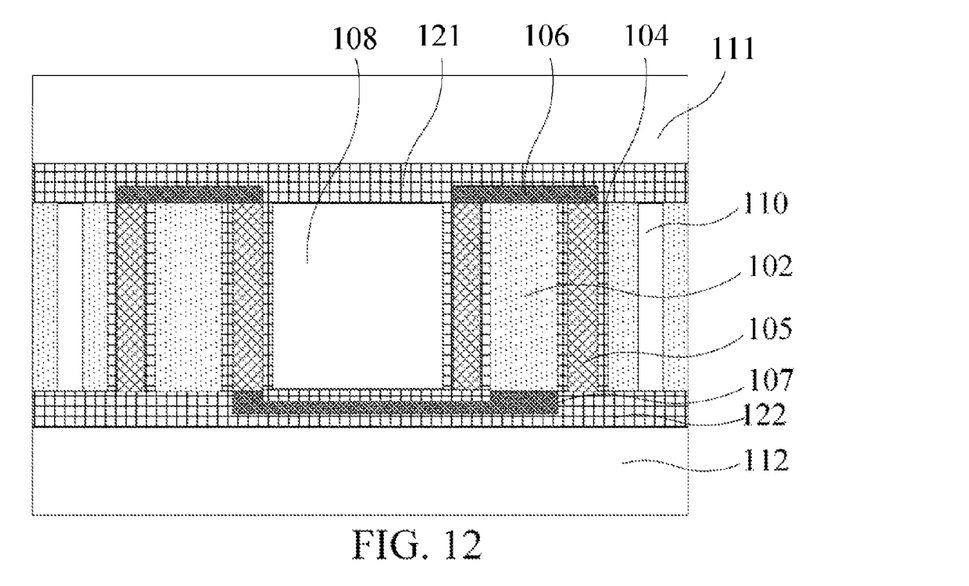
FIG. 12 is a schematic structural view of a miniature thermoelectric energy harvester consistent with the present invention, which has an annular isolation groove and adopts vacuum bonding.

Referring to FIG. 12, the basic structure of the miniature thermoelectric energy harvester in this embodiment is as described in Embodiment 5. The silicon substrate 101 is still maintained at the periphery around the thermopile of the miniature thermoelectric energy harvester. Here, the silicon substrate 101 has an annular isolation groove 110 surrounding the thermopile, the upper supporting substrate 111 is airtight bonded to the upper passivation layer 121, and the lower supporting substrate 112 is vacuum bonded to the lower passivation layer 122.

In summary, in the miniature thermoelectric energy harvester and fabrication method thereof consistent with the present invention, annular grooves are fabricated on a low-resistivity silicon substrate to define silicon thermoelectric columns, an insulating layer is fabricated on the annular grooves, a thermoelectric material is filled in the annular grooves to form annular thermoelectric columns, and then metal wirings, passivation layers and supporting substrates are fabricated, thereby completing the fabrication process. In the present invention, the silicon thermoelectric column is fabricated by directly using a silicon base material, which simplifies the fabrication process. Compared with a miniature thermoelectric energy harvester in the prior art, the present invention has the following advantages:

1) Fabrication of the thermocouple structure is completed by only one thin-film deposition process, which simplifies the fabrication process.

2) The use of silicon as a component of the thermocouple ensures that the thermocouple has a high Seebeck coefficient.

3) The use of vertical thermocouples having a column structure avoids suspended microstructures, thereby improving the mechanical stability of the thermoelectric energy harvester.

4) Since the thermocouple structure is bonded to the upper supporting substrate and the lower supporting substrate by wafer-level bonding, the fabrication efficiency is improved.

Therefore, the present invention effectively overcomes the disadvantages in the prior art, and has high industrial applicability.

The above description of the detailed embodiments is only to illustrate the preferred implementation according to the present invention, and it is not to limit the scope of the present invention. Accordingly, all modifications and variations completed by one of ordinary skill in the art should fall within the scope of the present invention defined by the appended claims.

What is claimed is:

1. A method for fabricating a miniature thermoelectric energy harvester, at least comprising:
   1) providing a silicon substrate, and etching an upper surface of the silicon substrate to form at least two annular grooves, two neighboring of which are arranged at an interval, so that all the annular grooves and silicon columns surrounded by the annular grooves form a thermopile region;
   2) forming an insulating layer on a surface of the annular groove, and then filling a thermoelectric material in the annular groove to form an annular thermoelectric column, so that the annular thermoelectric column and the silicon column surrounded by the annular thermoelectric column form a thermocouple;
   3) fabricating an upper metal wiring to connect the silicon column and the annular thermoelectric column in a same thermocouple, and then fabricating an upper passivation layer on the upper surface of the silicon substrate;
   4) providing an upper supporting substrate, and bonding the upper supporting substrate to the upper surface of the silicon substrate;
   5) thinning the silicon substrate until a lower surface of the thermocouple is exposed;
   6) fabricating a lower metal wiring to connect the annular thermoelectric column and the silicon column in two neighboring annular thermocouples, and then fabricating a lower passivation layer on a lower surface of the silicon substrate;
   7) etching the silicon substrate between two neighboring thermocouples to form an isolation structure; and
   8) providing a lower supporting substrate, and bonding the lower supporting substrate to the lower surface of the silicon substrate, thereby completing fabrication of a miniature thermoelectric energy harvester.

2. The method for fabricating a miniature thermoelectric energy harvester as in claim 1, wherein the annular thermoelectric column is a column structure having a rectangular ring or circular ring cross section, and the silicon column is a column structure having a rectangular or circular cross section.

3. The method for fabricating a miniature thermoelectric energy harvester as in claim 1, wherein the step 7) further comprises a step of filling an electrical and thermal insulating material in the isolation structure.

4. The method for fabricating a miniature thermoelectric energy harvester as in claim 1, wherein the step 7) further comprises a step of selectively etching a periphery around the thermopile region to form an annular isolation groove.

5. The method for fabricating a miniature thermoelectric energy harvester as in claim 4, wherein the bonding process in the step 4) is wafer-level hermetic bonding, and the bonding process in the step 8) is wafer-level vacuum bonding.

6. The method for fabricating a miniature thermoelectric energy harvester as in claim 1, wherein the lower supporting substrate comprises a CMOS circuit structure, the lower passivation layer is etched to form a contact hole, and the CMOS circuit structure is connected to the lower metal wiring through the contact hole.

7. The method for fabricating a miniature thermoelectric energy harvester as in claim 1, wherein the annular thermoelectric column is made of a BiTe-based material, a polysilicon material, or metal Cu, Ni or Au, and the silicon column is made of low-resistivity silicon.

8. A miniature thermoelectric energy harvester, at least comprising:
   a thermopile, comprising:
      at least two thermocouples, wherein each of the thermocouples is formed by a silicon column and an annular thermoelectric column surrounding the silicon column, and an isolation structure is formed between neighboring two thermocouples;
      an insulating layer, combined between the annular thermoelectric column and the silicon column;
      an upper metal wiring, connected to upper surfaces of the annular thermoelectric column and the silicon column in a same thermocouple; and
      a lower metal wiring, connected to lower surfaces of the annular thermoelectric column and the silicon column in two neighboring thermocouples;
   passivation layers, comprising:
      an upper passivation layer, combined to an upper surface of the thermopile; and
      a lower passivation layer, combined to a lower surface of the thermopile; and
   supporting substrates, comprising:
      an upper supporting substrate, combined to a surface of the upper passivation layer; and
      a lower supporting substrate, combined to a surface of the lower passivation layer.

9. The miniature thermoelectric energy harvester as in claim 8, wherein the annular thermoelectric column is a column structure having a rectangular ring or circular ring cross section, and the silicon column is a column structure having a rectangular or circular cross section.

10. The miniature thermoelectric energy harvester as in claim 8, wherein the miniature thermoelectric energy harvester further comprises an electrical and thermal insulating material filled in the isolation structure.

11. The miniature thermoelectric energy harvester as in claim 8, wherein the lower supporting substrate comprises a CMOS circuit structure, the lower passivation layer has a contact hole, and the CMOS circuit structure is connected to the thermopile through the contact hole.

12. The miniature thermoelectric energy harvester as in claim 8, wherein the annular thermoelectric column is made of a BiTe-based material, a polysilicon material, or metal Cu, Ni or Au, and the silicon column is made of low-resistivity silicon.

* * * * *